United States Patent
Chang et al.

[11] Patent Number: 6,080,607
[45] Date of Patent: Jun. 27, 2000

[54] METHOD FOR MANUFACTURING A TRANSISTOR HAVING A LOW LEAKAGE CURRENT

[75] Inventors: Chun Yen Chang; Po-Sheng Shih; Ting-Chang Chang, all of Hsinchu; Hsiao-Yi Lin, Hua-Lien Hsien, all of Taiwan

[73] Assignee: National Science Council, Taipei, Taiwan

[21] Appl. No.: 09/084,005

[22] Filed: May 26, 1998

[51] Int. Cl.⁷ .................................................. H01L 31/0328
[52] U.S. Cl. ........................... 438/151; 438/155; 438/166; 438/30; 438/163; 438/158; 438/149; 257/192; 257/66; 257/350
[58] Field of Search ...................... 257/192, 347, 257/616, 63, 65, 66, 613, 631; 438/155, 151, 166, 63, 33, 148, 158

[56] References Cited

U.S. PATENT DOCUMENTS

| | | | |
|---|---|---|---|
| 4,744,859 | 5/1988 | Hu et al. | 156/643 |
| 5,200,351 | 4/1993 | Hadjizadeh-Amini | 437/44 |
| 5,576,556 | 11/1996 | Takemura et al. | 257/69 |
| 5,604,139 | 2/1997 | Codama et al. | 437/41 |
| 5,648,277 | 7/1997 | Zhang et al. | 437/21 |
| 5,661,051 | 8/1997 | Yeh et al. | 438/158 |
| 5,663,077 | 9/1997 | Adachi et al. | 438/151 |
| 5,677,240 | 10/1997 | Murakami et al. | 437/195 |
| 5,686,328 | 11/1997 | Zhang et al. | 437/41 |
| 5,698,869 | 12/1997 | Yoshimi et al. | 257/192 |
| 5,719,065 | 2/1998 | Takemura et al. | 437/21 |
| 5,741,718 | 4/1998 | Codama et al. | 437/41 |
| 5,757,456 | 5/1998 | Yamazaki et al. | 349/151 |
| 5,786,241 | 7/1998 | Shimada | 438/163 |
| 5,808,315 | 9/1998 | Murakami et al. | 257/59 |
| 5,834,327 | 11/1998 | Yamazaki et al. | 438/30 |
| 5,904,508 | 5/1999 | Codama et al. | 438/151 |
| 5,914,498 | 6/1999 | Suzawa et al. | 257/66 |
| 5,943,561 | 8/1999 | Cho | 438/152 |
| 5,946,561 | 8/1999 | Yamazaki et al. | 438/166 |
| 5,956,581 | 9/1999 | Yamazaki et al. | 438/166 |
| 5,966,594 | 10/1999 | Adachi et al. | 438/151 |

OTHER PUBLICATIONS

Van Zant, Peter, "Microchip Fabrication" 3rd Edition pp: 359–372 Deposition Methods, 1997.
Wolf, Stanley, "Silicon Processing for hte VLSI Era, vol. 2–Process Integration" Spacers pp: 212–214, 1990.

*Primary Examiner*—Charles Bowers
*Assistant Examiner*—Laura Schillinger
*Attorney, Agent, or Firm*—Micheal D. Bednarek; Crowell & Moring LLP

[57] ABSTRACT

The invention provides a method for manufacturing a transistor having a low leakage current. In general, spacers must be formed to isolate a gate from a subsequently-formed drain, thereby reducing a leakage current. In the invention, the spacers are formed on the vertical sides of the gate by using a selective deposition process. Therefore, the method for manufacturing a transistor having a low leakage current according to the invention not only constitutes a simplified process, but also controls the widths of the spacers precisely, so that the leakage current of the transistor can be greatly decreased.

20 Claims, 5 Drawing Sheets

METHOD FOR MANUFACTURING A TRANSISTOR HAVING A LOW LEAKAGE CURRENT

BACKGROUND OF THE INVENTION

1. Field of the Invention

The present invention relates to a method for manufacturing a transistor, and in particular to a method for manufacturing a transistor having a low leakage current.

2. Description of the Related Art

Thin Film Transistors (hereinafter referred to as TFTs) are commonly applied in active matrix LCDs and SRAMs. TFTs are classified into amorphous silicon TFTs and polysilicon TFTs. As compared to amorphous TFTs, polysilicon TFTs have a higher mobility of carriers and a greater current driving capability. However, polysilicon TFTs have greater leakage currents, disallowing their use in large area LCDs. Therefore, the reduction of leakage currents in polysilicon TFTs is an important issue.

The key factor affecting the magnitude of a leakage current is the intensity of the electric field inside the depletion region near a drain. Reducing the electric field in the depletion region results in a corresponding reduction in the leakage current. One method to reduce the intensity of the electric field inside the depletion region is to form spacers on both sides of the gate, thereby preventing the gate from overlapping with the drain. In the past, there were two ways to manufacture these spacers, which will be described along with the disadvantages thereof as follows:

(1) An additional mask is added before performing the ion-implanting to form the drain/source, thereby defining an offset region between the gate and the drain, so that the drain can not overlap with the gate. The use of an additional mask, however, results in increased complexity during the TFT manufacturing process. Furthermore, errors in mask alignment are common, impeding the precise control of spacer width.

(2) A silicon oxide layer is first formed on a substrate and a gate. Then, a back etching is performed to form spacers on both sides of the gate. While this method allows precise control of the widths of the spacers, active ions used for the back etching can cause varying amounts of damage to devices, particularly gate oxide layers.

In addition to TFTs, general MOS transistors also suffer from the problem of leakage currents.

SUMMARY OF THE INVENTION

In view of the above, the objective of the present invention is to provide a method for manufacturing a transistor, such as a TFT or a MOS transistor, having a low leakage current. A method for manufacturing a polysilicon TFT having a low leakage current according to the invention, suitable for a substrate, comprises the following steps: First, a polysilicon layer is formed on the substrate, and a first deposition-shielding layer is formed on the polysilicon layer. Then, a poly gate with a second deposition-shielding layer thereon is formed on the first deposition-shielding layer. Subsequently, a first ion-implanting is performed to form a lightly-doped drain/source in the polysilicon layer on both sides of the poly gate, respectively. Thereafter, spacers are formed on the vertical sides of the poly gate by a selective deposition process during which no spacers are deposited on the first or second deposition-shielding layers. The second deposition-shielding layer and the part of said first deposition-shielding layer that is not covered by said spacers are then removed. Subsequently, a second ion-implanting is performed to a form drain/source in the polysilicon layer on either side of said spacers.

The method described above can be also used to manufacture an amorphous TFT transistor, the main difference being that the polysilicon layer is replaced with an amorphous silicon layer.

As to a method for manufacturing a MOS transistor having a low leakage current, suitable for a substrate, comprises the following steps: First, a first deposition-shielding layer is formed on the substrate. Then a poly gate with a second deposition-shielding layer thereon is formed on the first deposition-shielding layer. After that, a first ion-implanting is performed to form a lightly-doped drain/source in the substrate on both sides of said poly gate. Spacers are formed on the vertical sides of the poly gate by a selective deposition process during which no spacers are deposited on the first or second deposition-shielding layers. Then, the second deposition-shielding layer and the part of the first deposition-shielding layer that is not covered by said spacers are removed. Finally, a second ion-implanting is performed to form a drain/source in the substrate on either side of the spacers.

In the method for manufacturing a transistor having a low leakage current according to the invention, spacers are formed on the vertical sides of a gate by a selective deposition process. Since the widths of the spacers can be precisely controlled through appropriate depositing recipes and the overlapping between the gate and a subsequently-formed drain can be easily prevented, the leakage current is decreased. Furthermore, in comparison with the prior art, there is no need to use an additional mask or back etching during the formation of the spacers. Therefore, the invention has the advantages of a simplified process and the prevention of ion damage to the transistor.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE EMBODIMENTS

Embodiment 1

Referring to FIGS. 1A~1G, a method for manufacturing a TFT having a low leakage current is shown. The method for manufacturing a TFT having a low leakage current according to the invention, suitable for a substrate 10, comprises the following steps:

Step 1

Figure 1A:
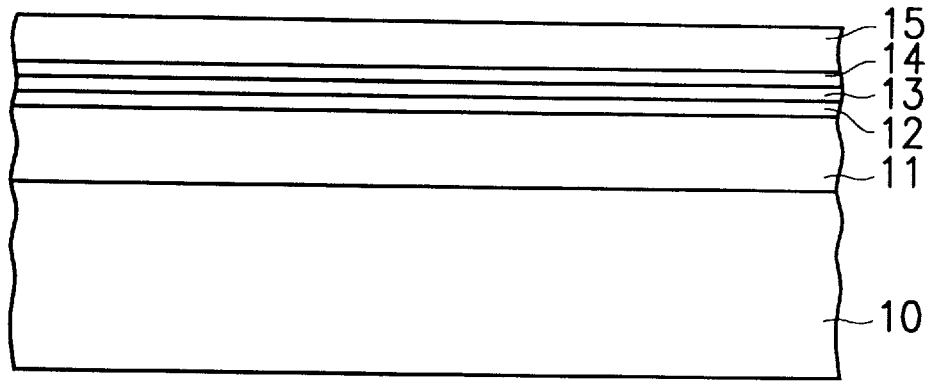
FIGS. 1A~1G are cross-sectional views showing a method for manufacturing a TFT having a low leakage current in accordance with a first preferable embodiment of the invention.

As shown in FIG. 1A, a semiconductor layer 11, such as a polysilicon layer, a first dielectric layer 12, such as a silicon oxide layer, a first deposition-shielding layer 13, such as a silicon nitride layer, a second dielectric layer 14, such as a silicon oxide layer, and a gate 15, such as a poly gate, are formed on the substrate 10 in order by chemical vapor deposition (CVD).

Step 2

Figure 1B:
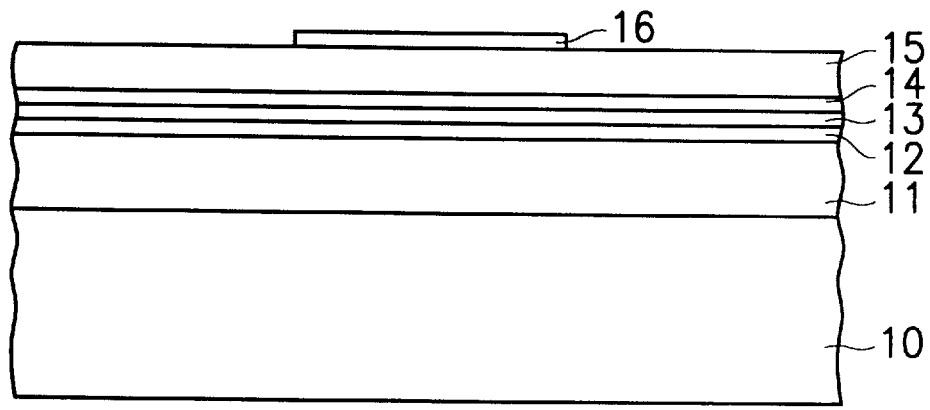

As shown in FIG. 1B, a second deposition-shielding layer 16, such as a photoresist, is formed on the poly gate 15 by photolithography.

Step 3

Figure 1C:
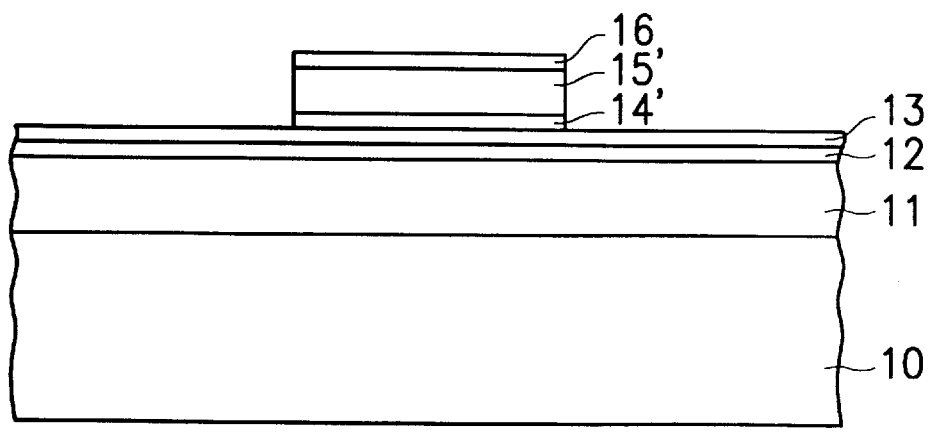

As shown in FIG. 1C, a silicon oxide layer 14' and a poly gate 15' are defined by plasma etching.

Step 4

Figure 1D:
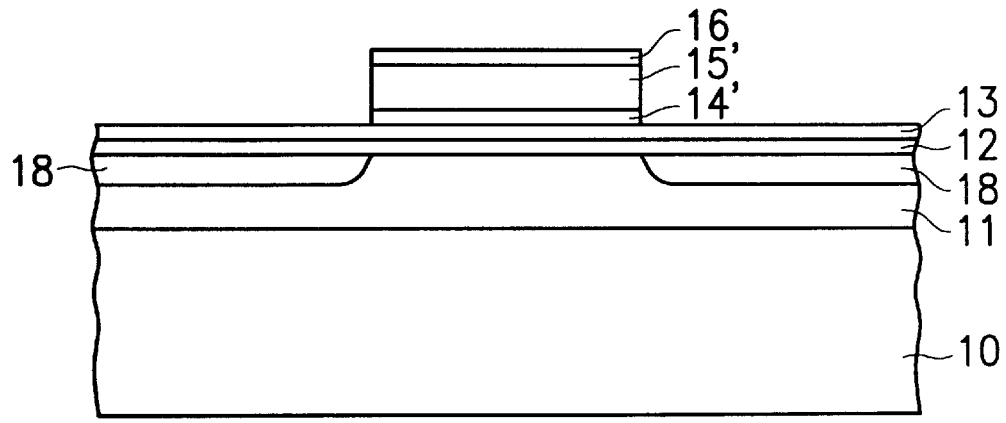

As shown in FIG. 1D, a first ion-implanting is performed to form lightly-doped drain/source 18 in the polysilicon layer 11 on both sides of the poly gate 15'.

Step 5

Figure 1E:
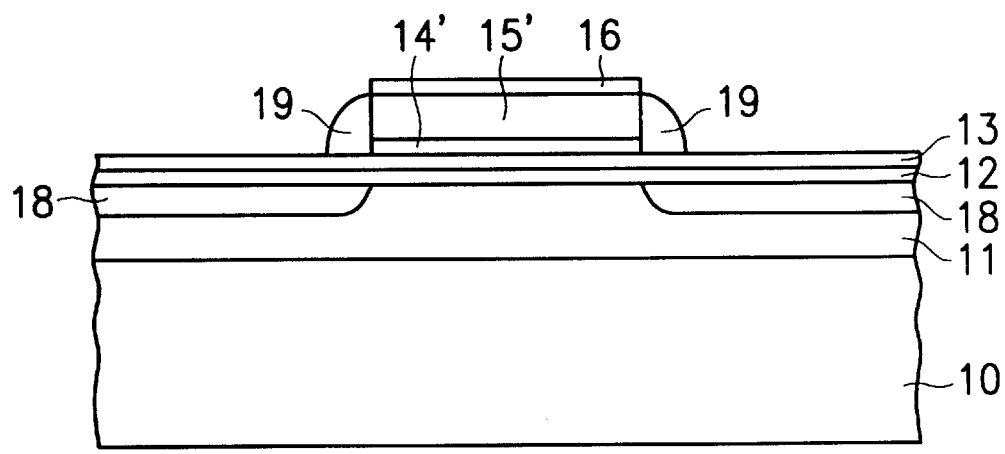

As shown in FIG. 1E, spacers 19, such as silicon dioxide spacers, are formed on the vertical sides of the silicon oxide 14' and the poly gate 15' by using a selective deposition process, such as a selective liquid-phase deposition process, during which no spacers are deposited on the silicon nitride layer 13 and the photoresist 16. In the selective liquid-phase deposition process, 35 g of $SiO_2$ powder (99.999%), 1l of $H_2SiF_6$ solution (4 moles/l) and D.I. water (15~50%) are prepared and then mixed well for the deposition of the silicon dioxide spacers 19.

Step 6

Figure 1F:
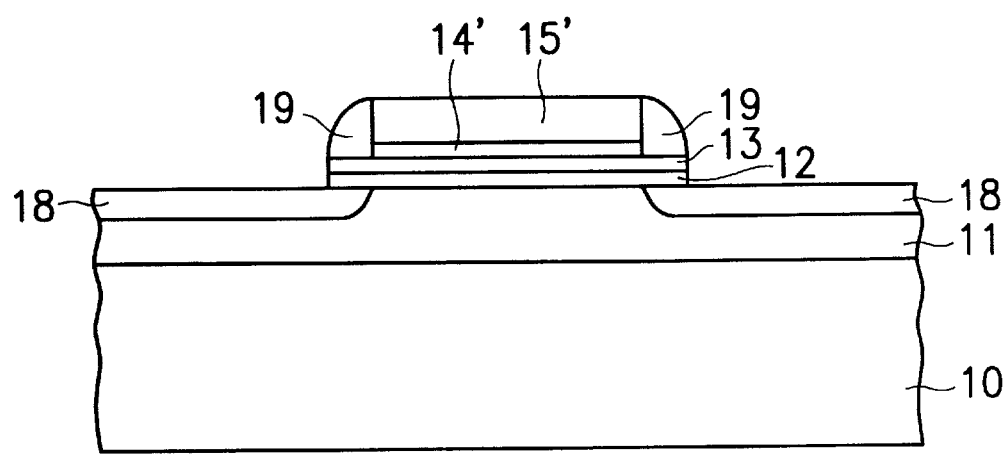

As shown in FIG. 1F, the photoresist 16 and the parts of the silicon nitride layer 13 and silicon oxide layer 12 not covered by the silicon dioxide spacers 19 are removed by plasma etching.

Step 7

Figure 1G:
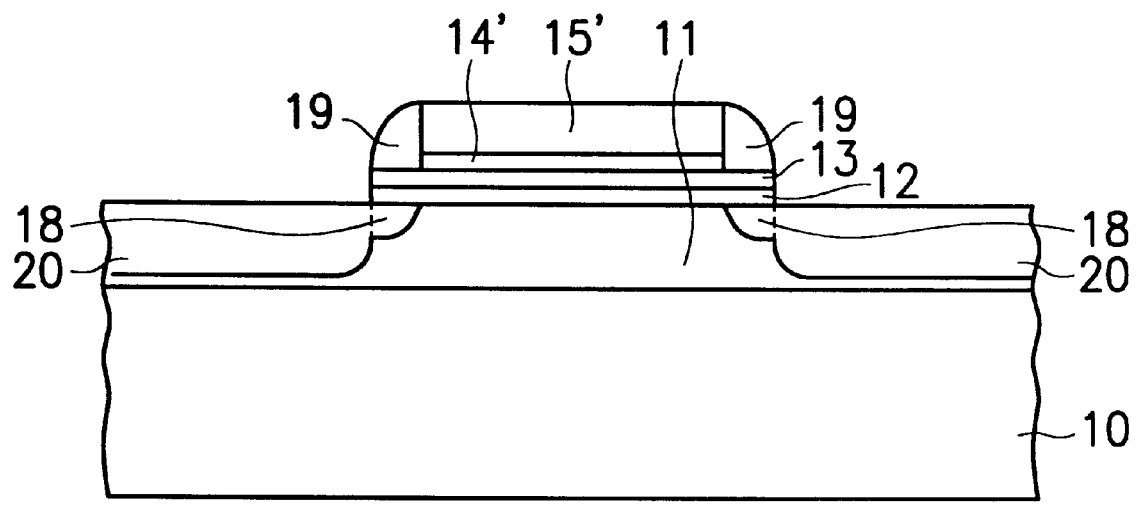

As shown in FIG. 1G, a second ion-implanting is performed to form drain/source 20 in the polysilicon layer 11 on either side of the silicon dioxide spacers 19.

Figure 2:
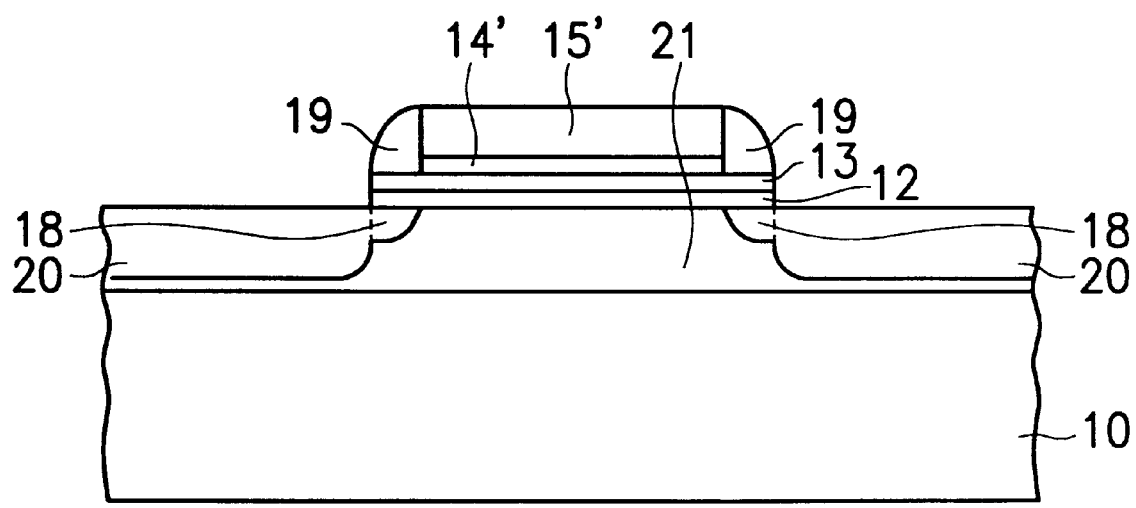
FIG. 2 is a cross-sectional view showing another TFT having a low leakage current manufactured by a method in accordance with a first preferable embodiment of the invention.

The process described above can also be used to manufacture an amorphous silicon TFT, wherein the only difference is that the polysilicon layer 11 is replaced with an amorphous silicon layer 21, as shown in FIG. 2. FIG. 2 is a schematic view of an amorphous silicon TFT having a low leakage current manufactured by a method according to the invention.

Embodiment 2

Referring to FIGS. 3A~3G, a method for manufacturing a MOS transistor having a low leakage current according to the invention is shown. The method for manufacturing a MOS transistor having a low leakage current, suitable for a substrate 10, comprises the following steps:

Step 1

Figure 3A:
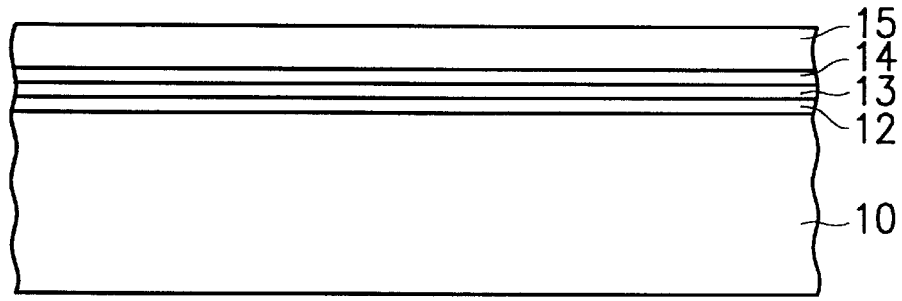
FIGS. 3A~3G are cross-sectional views showing a method for manufacturing a MOS transistor in accordance with a second preferable embodiment of the invention.

As shown in FIG. 3A, a first dielectric layer 12, such as a silicon oxide layer, a first deposition-shielding layer 13, such as a silicon nitride layer, a second dielectric layer 14, such as silicon oxide layer, and a gate 15, such as a poly gate, are formed on the substrate 10 in order by chemical vapor deposition (CVD).

Step 2

Figure 3B:
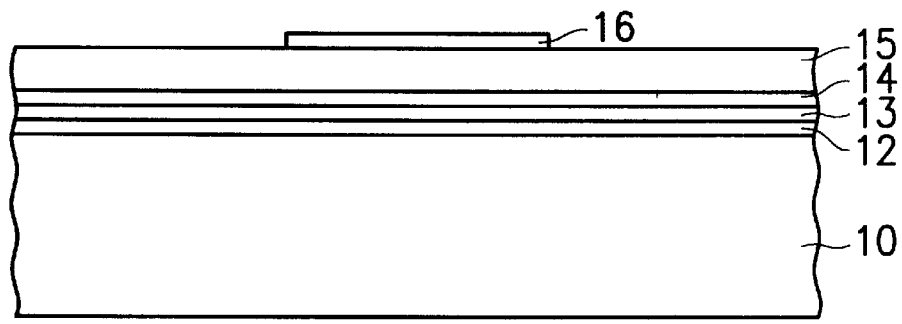

As shown in FIG. 3B, a second deposition-shielding layer 16, such as a photoresist, is formed on the poly gate 15 by photolithography.

Step 3

Figure 3C:
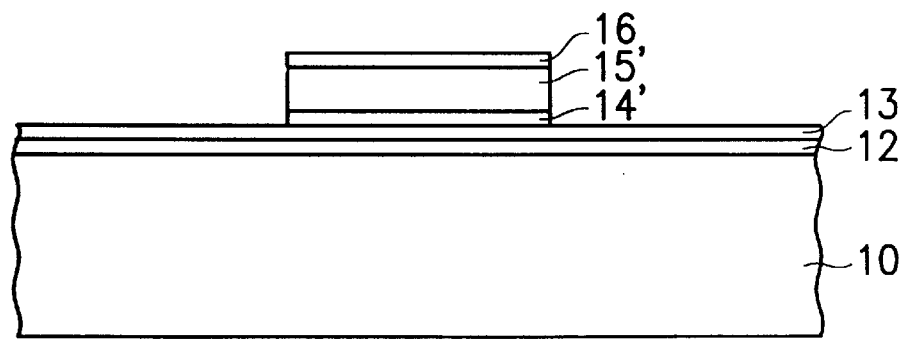

As shown in FIG. 3C, a silicon oxide layer 14' and a poly gate 15', are defined by plasma etching.

Step 4

Figure 3D:
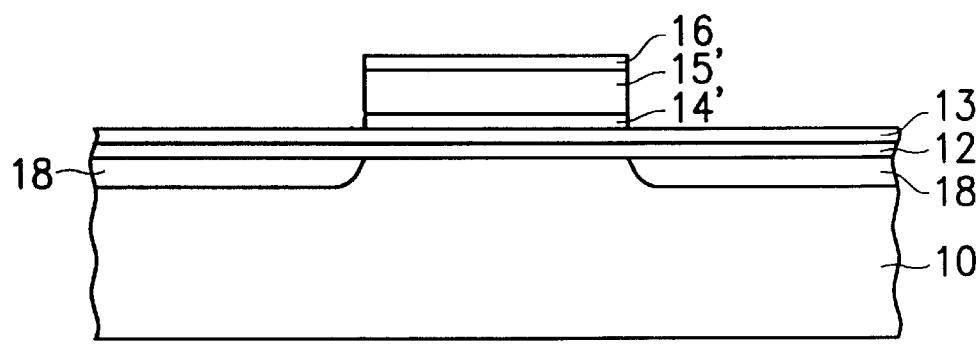

As shown in FIG. 3D, a first ion-implanting is performed to form lightly-doped drain/source 18 in the substrate 10 on both sides of the poly gate 15'.

Step 5

Figure 3E:
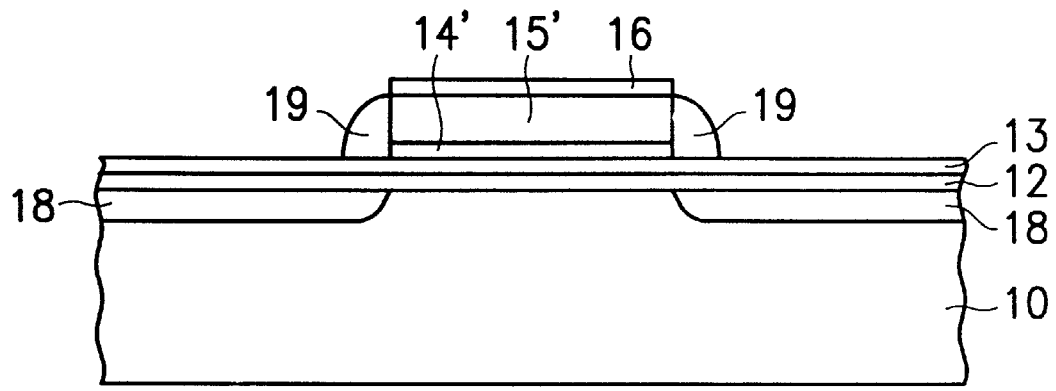

As shown in FIG. 3E, spacer 19, such as silicon dioxide spacers, are formed on the vertical sides of the silicon oxide 14' and the poly gate 15' by using a selective deposition process, such as a selective liquid-phase deposition process, during which no spacers are deposited on the silicon nitride layer 13 and the second deposition-shielding layer 16. In the selective liquid-phase deposition process, 35 g of $SiO_2$ powder (99.999%), 1l of $H_2SiF_6$ solution (4 moles/l) and D.I. water (15~50%) are prepared and then mixed well for the deposition of the silicon dioxide spacers 19.

Step 6

Figure 3F:
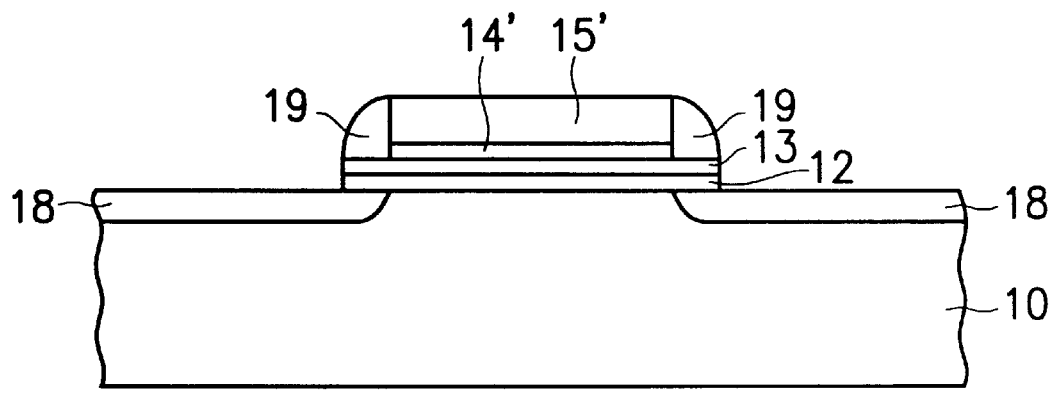

As shown in FIG. 3F, the photoresist 16 and the parts of the silicon oxide layer 12 and the silicon nitride layer 13 not covered by the silicon dioxide spacers 19 are removed by plasma etching.

Step 7

Figure 3G:
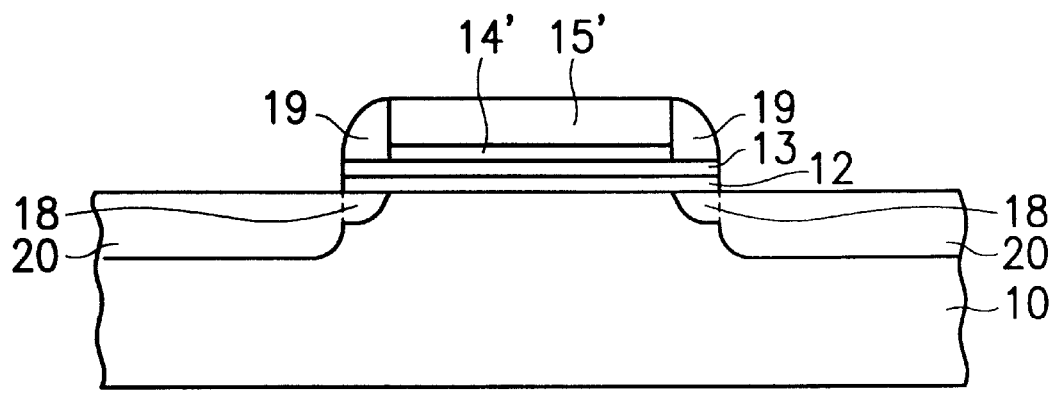

As shown in FIG. 3G, a second ion-implanting is performed to form drain/source 20 in the substrate 10 on both sides of the silicon dioxide spacers 19.

As described above, according to the method for manufacturing a transistor having a low leakage current of the invention, silicon dioxide spacers are formed on vertical sides of a gate by using a selective deposition process. Since the widths of the spacers can be precisely controlled through appropriate depositing recipes and the overlapping between the gate and a subsequently-formed drain can be easily prevented, the leakage current is decreased. Furthermore, in comparison with the prior art, there is no need to use an additional mask or back etching during the formation of the spacers. Therefore, the invention has the advantages of a simplified process and the prevention of ion damage to the transistor.

While the invention has been described by way of example and in terms of a preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for manufacturing a transistor having a low leakage current, suitable for a substrate, comprising:

forming a semiconductor layer on said substrate;

forming a first deposition-shielding layer on said semiconductor layer wherein said first deposition-shielding layer is a silicon nitride layer;

forming a gate with a second deposition-shielding layer thereon, on said first deposition-shielding layer;

performing a first ion-implanting to form a lightly-doped drain/source in said semiconductor layer on both sides of said gate, respectively;

forming spacers on the vertical sides of said gate by using a selective deposition process during which no spacers are deposited on said first deposition-shielding layer and said second deposition-shielding layer wherein said selective deposition process is completed by using a selective liquid-phase deposition method;

removing the part of said first deposition-shielding layer which is located on both sides of said spacers;

performing a second ion-implanting to form a drain/source in said semiconductor layer on both sides of said spacers.

2. A method for manufacturing a transistor having a low leakage current as claimed in claim 1, further comprising:

forming a first dielectric layer on said semiconductor layer before forming said first deposition-shielding layer.

3. A method for manufacturing a transistor having a low leakage current as claimed in claim 2, further comprising:

removing part of said first dielectric layer on both sides of said spacers after forming said spacers.

4. A method for manufacturing a transistor having a low leakage current as claimed in claim 3, further comprising:

forming a second dielectric layer between said first deposition-shielding layer and said gate.

5. A method for manufacturing a transistor having a low leakage current as claimed in claim 4, wherein said second deposition-shielding layer is a photoresist.

6. A method for manufacturing a transistor having a low leakage current as claimed in claim 5, wherein said first dielectric layer is a silicon oxide layer.

7. A method for manufacturing a transistor having a low leakage current as claimed in claim 6, wherein said second dielectric layer is a silicon oxide layer.

8. A method for manufacturing a transistor having a low leakage current as claimed in claim 7, wherein said spacers are silicon dioxide spacers.

9. A method for manufacturing a transistor having a low leakage current as claimed in claim 8, wherein said semiconductor layer is a polysilicon layer.

10. A method for manufacturing a transistor having a low leakage current as claimed in claim 8, wherein said semiconductor layer is an amorphous silicon layer.

11. A method for manufacturing a transistor having a low leakage current as claimed in claim 9, wherein said gate is a poly gate.

12. A method for manufacturing a transistor having a low leakage current, suitable for a substrate, comprising:

forming a first deposition-shielding layer on said substrate wherein said first deposition-shielding layer is a silicon nitride layer;

forming a gate with a second deposition-shielding layer thereon, on said first deposition-shielding layer;

performing a first ion-implanting to form a lightly-doped drain/source in said substrate on both sides of said gate;

forming spacers on the vertical sides of said gate by using a selective deposition process during which no spacers are deposited on said first deposition-shielding layer and said second deposition-shielding layer wherein said selective deposition process is completed by using a selective liquid-phase deposition method;

removing the part of said first deposition-shielding layer which is located on both sides of said spacers; and performing a second ion-implanting to form a drain/source in said substrate on both sides of said spacers.

13. A method for manufacturing a transistor having a low leakage current as claimed in claim 12, further comprising:

forming a first dielectric layer on said substrate before forming said first deposition-shielding layer.

14. A method for manufacturing a transistor having a low leakage current as claimed in claim 13, further comprising:

removing the part of said first dielectric layer which is located on both sides of said spacers after forming said spacers.

15. A method for manufacturing a transistor having a low leakage current as claimed in claim 14, further comprising:

forming a second dielectric layer between said first deposition-shielding layer and said gate.

16. A method for manufacturing a transistor having a low leakage current as claimed in claim 15; wherein said second deposition-shielding layer is a photoresist.

17. A method for manufacturing a transistor having a low leakage current as claimed in claim 16, wherein said first dielectric layer is a silicon oxide layer.

18. A method for manufacturing a transistor having a low leakage current as claimed in claim 17, wherein said second dielectric layer is a silicon oxide layer.

19. A method for manufacturing a transistor having a low leakage current as claimed in claim 18, wherein said spacers are silicon dioxide spacers.

20. A method for manufacturing a transistor having a low leakage current as claimed in claim 18, wherein said gate is a poly gate.

* * * * *